US012724348B2

(12) United States Patent
Xu et al.

(10) Patent No.: US 12,724,348 B2
(45) Date of Patent: Sep. 1, 2026

(54) METHOD FOR ADJUSTING LOCAL THICKNESS OF PHOTORESIST

(71) Applicant: Shanghai Huali Integrated Circuit Corporation, Shanghai (CN)

(72) Inventors: Dongyu Xu, Shanghai (CN); Zhihong Wang, Shanghai (CN); Hongwen Zhao, Shanghai (CN); Wenzhan Zhou, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 740 days.

(21) Appl. No.: 18/141,952

(22) Filed: May 1, 2023

(65) Prior Publication Data

US 2024/0019783 A1 Jan. 18, 2024

(30) Foreign Application Priority Data

Jul. 12, 2022 (CN) ......................... 202210817456.1

(51) Int. Cl.
*G03F 7/213* (2006.01)
*H10P 76/00* (2026.01)

(52) U.S. Cl.
CPC .............. *G03F 7/213* (2013.01); *H10P 76/00* (2026.01)

(58) Field of Classification Search
CPC ... G03F 7/22; G03F 7/213; G03F 7/09; G03F 7/094
See application file for complete search history.

(56) References Cited

U.S. PATENT DOCUMENTS

2005/0026047 A1* 2/2005 Yang ......................... G03F 1/36 430/296
2010/0261118 A1* 10/2010 Liu ......................... G03F 7/203 430/319
2015/0303057 A1* 10/2015 Lee ................... H10P 14/69392 438/763
2021/0287912 A1* 9/2021 Shiba .................... H10P 50/283

* cited by examiner

*Primary Examiner* — Daborah Chacko-Davis
(74) *Attorney, Agent, or Firm* — Banner & Witcoff, Ltd.

(57) ABSTRACT

The present application provides a method for adjusting the local thickness of a photoresist, and a semiconductor front layer structure. The thickness of the photoresist layer in a first region of the stack structure is more than the thickness of the photoresist layer in a second region. The photomask is configured to include an auxiliary pattern for exposing the first region and another pattern for exposing the second region. The first region and the second region of the photoresist layer are exposed simultaneously by one photomask. The exposure intensity is adjusted so that part of the surface of the first region is dissolved during the development, the auxiliary pattern is not transferred to the photoresist layer in the first region, resulting in decreased thickness of the photoresist layer in the first region after development. After development, the other pattern is transferred to the photoresist layer in the second region.

7 Claims, 2 Drawing Sheets providing a semiconductor front layer structure, the semiconductor front layer structure comprising a silicon substrate; an STI region for isolating active regions in the silicon substrate, the silicon substrate in the active regions being provided with strip structures with different heights; and a stack structure covering the strip structures with different heights, the strip structures with different heights enabling the stack structure to form regions with different surface heights Step 2: spin-coat a photoresist layer on the surface of the stack structure, a region of the photoresist layer with a greater height on the surface of the stack structure being a first region, the thickness of the photoresist layer in the first region being H1; a region of the photoresist layer with a smaller height on the surface of the stack structure being a second region, the thickness of the photoresist layer in the second region being H2, H1 being more than H2

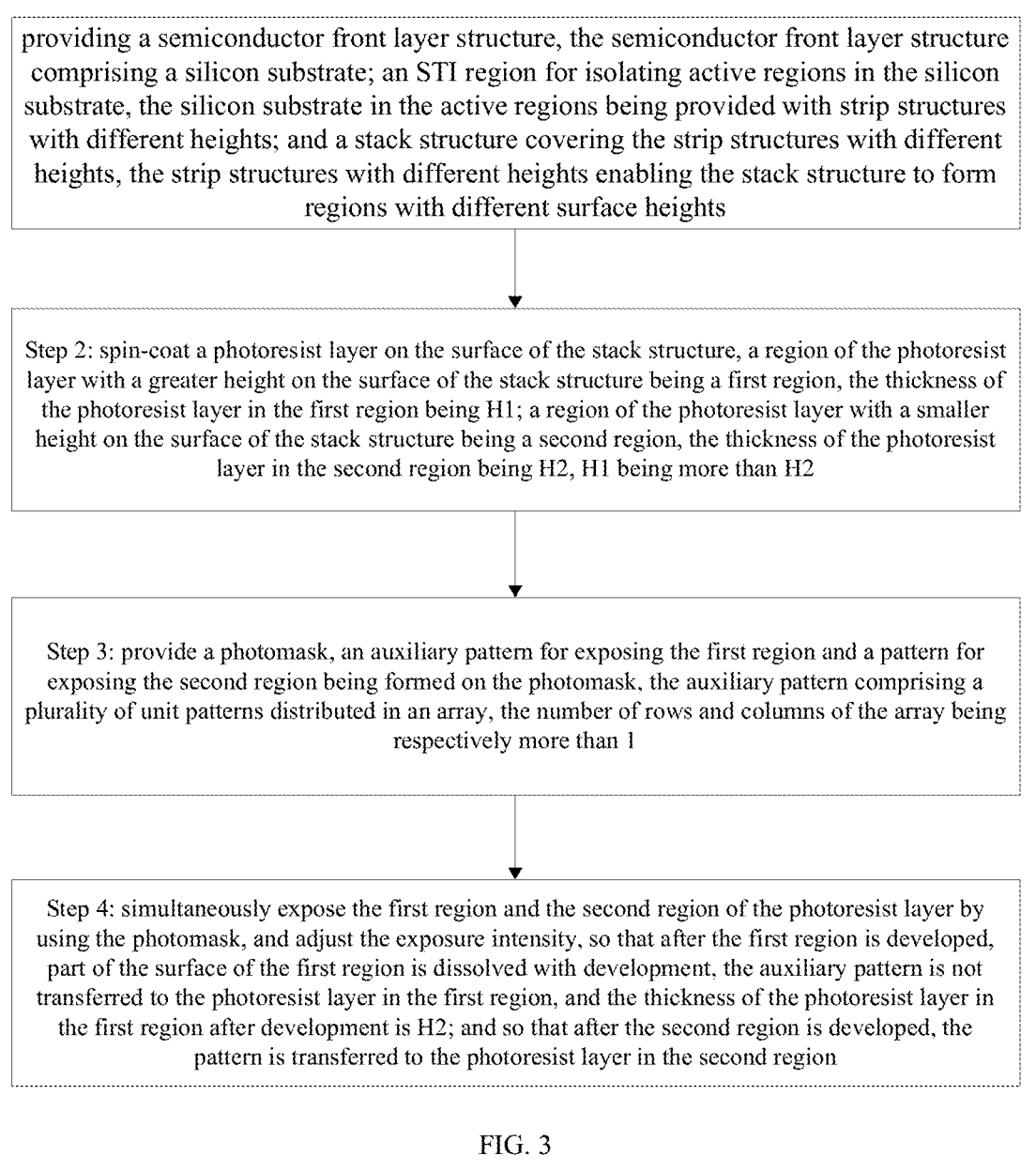

Step 3: provide a photomask, an auxiliary pattern for exposing the first region and a pattern for exposing the second region being formed on the photomask, the auxiliary pattern comprising a plurality of unit patterns distributed in an array, the number of rows and columns of the array being respectively more than 1

Step 4: simultaneously expose the first region and the second region of the photoresist layer by using the photomask, and adjust the exposure intensity, so that after the first region is developed, part of the surface of the first region is dissolved with development, the auxiliary pattern is not transferred to the photoresist layer in the first region, and the thickness of the photoresist layer in the first region after development is H2; and so that after the second region is developed, the pattern is transferred to the photoresist layer in the second region

FIG. 3

METHOD FOR ADJUSTING LOCAL THICKNESS OF PHOTORESIST

CROSS-REFERENCES TO RELATED APPLICATIONS

This application claims priority to Chinese patent application No. CN 202210817456.1, filed on Jul. 12, 2022 at CNIPA, and entitled "METHOD FOR ADJUSTING LOCAL THICKNESS OF PHOTORESIST", the disclosure of which is incorporated herein by reference in entirety.

TECHNICAL FIELD

The present application relates to the field of semiconductor technology, in particular, to a method for adjusting the local thickness of a photoresist.

BACKGROUND

With the continuous development of semiconductor manufacturing process technology, the process for fin field effect transistor structures has become the mainstream for below 14 nm technology. The 3D stereoscopic structure is quite different from the 2D transistor structure in the previous (22 nm and larger) manufacturing process. This is true especially in the middle range of the process, because of the existence of the fin structures which may have different heights, even when SOC (Spin On Carbon) or SOG (Spin On Glass) technique is applied, because the thickness of photoresist layers in different pattern regions on the silicon wafer can still vary in a great extent, which poses a serious challenge to the photolithography technology.

Therefore, a novel method is needed to solve the above problem.

BRIEF SUMMARY

The present application provides a method for adjusting the local thickness of a photoresist layer, which can solve the problem of uneven thickness of photoresist layer on stacked layers from fin structures having different heights.

The method for adjusting the local thickness of photoresist according to the present application includes:

step 1: providing a semiconductor front layer structure, wherein the semiconductor front layer structure comprises a silicon substrate;
  an shallow-trench-isolation (STI) area for isolating active regions in the silicon substrate, wherein the active regions of the silicon substrate are configured to include strip structures, wherein the strip structures are configured to have different heights; and
  a stack structure disposed on the strip structures, wherein the stack structure forms regions of different surface heights from the uneven strip structures underneath, step 2: spin-coating a photoresist layer on a top surface of the stack structure, wherein the photoresist layer disposed on a portion of the stack structure having a higher surface comprises a first thickness H1, and the photoresist layer disposed on a portion of the stack structure having a lower surface comprises a second thickness H2, wherein H1>H2;

step 3: providing a photomask, wherein the photomask comprises an auxiliary pattern for exposing the first region and another pattern for exposing the second region, wherein the auxiliary pattern comprises a plurality of unit patterns distributed in an array, wherein a number of rows and a number of columns in the array are respectively integers larger than 1; and step 4: exposing the first region and the second region of the photoresist layer simultaneously by the photomask; and
  adjusting an exposure intensity to achieve under-exposure in the first region, wherein after photoresist development only part of the first region is dissolved, the auxiliary pattern is not transferred to the photoresist layer into the first region, and a thickness of the photoresist layer in the first region becomes H2; and wherein the other pattern on the photomask is transferred of the photoresist layer in the second region.

Exemplarily, in step 1, the stack structure includes NDC2, SiO2, NDC, NF and TiN sequentially stacked from bottom to top on the silicon substrate.

Exemplarily, in step 3, the unit patterns are strip-shaped rectangular structures.

Exemplarily, in step 3, the spacing between each unit pattern and an adjacent unit pattern is 40 nm.

Exemplarily, in step 3, the dimension of the unit patterns is 30 nm.

Exemplarily, in step 2, the photoresist layer is a positive photoresist.

Exemplarily, in step 4, the thickness of the photoresist layer in the first region after development is equal to the thickness of the photoresist layer in the second region after development.

Exemplarily, the method is used in a process for a FinFET structure with a process node of 14 nm.

Exemplarily, in step 3, the CD of the auxiliary pattern is less than the minimum dimension in a design rule of an exposure layer.

As described above, the method of adjusting the local thickness of the photoresist provided by the present application has the following beneficial effects: the disclosed embodiment thins the region with the thick photoresist layer by adding an auxiliary pattern, and expose other regions with normal procedure simultaneously to form the unmodified pattern. For the region with the thick photoresist layer, part of the surface of the photoresist layer is dissolved during photoresist development after adjusting the local overall light intensity and the dimension (CD) of the auxiliary pattern to achieve the goal of modifying the local thickness of the photoresist.

BRIEF DESCRIPTION OF THE DRAWINGS

FIG. 3 illustrates a flowchart of a method for adjusting the local thickness of a photoresist according to the present disclosure.

DETAILED DESCRIPTION OF THE APPLICATION

The embodiments of the present application will be described below through specific examples. Those skilled in the art can easily understand other advantages and effects of the present application from the content disclosed in the description. The present application may also be implemented or applied in other specific ways. The details in the description may also be modified or changed based on different views and applications without departing from the spirit of the present application.

Figure 1:
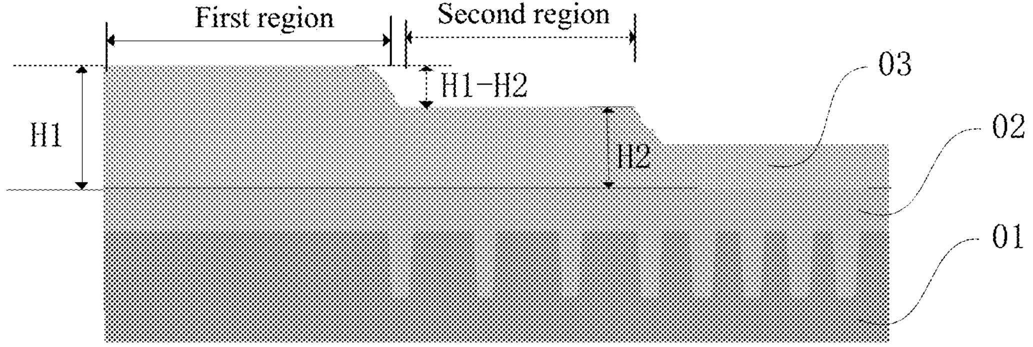
FIG. 1 illustrates a schematic diagram of a cross-sectional structure of a semiconductor front layer structure according to the present disclosure.

Referring to FIG. 1 to FIG. 3. It should be noted that the drawings provided in the embodiments only illustrate the basic concept of the present application in a schematic way, thus only illustrate the components related to the present application, and are not drawn according to the number, shape and size of the components in the actual implementation. The type, number and scale of each component in the actual implementation may be changed freely, and the layout configuration of the component may be more complex.

The present application discloses a method for adjusting the local thickness of a photoresist. Referring to FIG. 3, it illustrates a flowchart of the method for adjusting the local thickness of the photoresist. The method at least includes the following steps:

In step 1, a front layer of a semiconductor structure is provided. The semiconductor front layer structure includes a silicon substrate, an STI area for isolating active regions in the silicon substrate, and a stack structure covering the Strip structures with different heights. The silicon substrate in the active regions is provided with Strip structures with different heights. The Strip structures with different heights enable the stack structure to form regions with different surface heights.

Further, in this embodiment of the present application, in step 1, the stack structure includes NDC2, SiO2, NDC, NF and TiN sequentially stacked from bottom to top on the silicon substrate. The strip structure in the present invention is a Fin structure, that is, the Fin structure in FinFET.

Referring to FIG. 1, in step 1, a semiconductor front layer structure is provided. The semiconductor front layer structure includes a silicon substrate 01, a shallow-trench-isolation (STI) area for isolating active regions from each other in the silicon substrate 01, strip structures comprising elements of different heights disposed on the silicon substrate 01, and a stack structure 02 disposed on top of the strip structures (one structure is drawn to represent the stack structure 02 in FIG. 1). The silicon substrate in the active regions is provided with strip structures which have different heights. The strip structures which have different heights enable the stack structures to form regions having different heights above the surface. For the sake of intuitive display, the stack structure having different heights is not illustrated in FIG. 1. In this embodiment, in step 1, the stack structure 02 includes NDC2 (Second Nitrogen doped silicon carbide), silicon dioxide (SiO2), NDC (Nitrogen doped silicon carbide), NF (Nitrogen Trifluoride) and titanium nitride (TiN) sequentially stacked from bottom to top on the silicon substrate.

In step 2, a photoresist layer is spin-coated on the surface of the stack structure. A region of the photoresist layer with a greater height on the surface of the stack structure is the first region. The thickness of the photoresist layer in the first region is H1. A region of the photoresist layer with a smaller height on the surface of the stack structure is a second region. The thickness of the photoresist layer in the second region is H2. H1 is more than H2.

Further, in this embodiment of the present application, in step 2, the photoresist layer is a positive photoresist.

Referring to FIG. 1, in step 2, a photoresist layer 03 is spin-coated on the surface of the stack structure 02. A region of the photoresist layer 03 with a greater height on the surface of the stack structure 02 is a first region. The thickness of the photoresist layer 03 in the first region is H1. A region of the photoresist layer 03 with a smaller height on the surface of the stack structure 02 is a second region. The thickness of the photoresist layer in the second region is H2. H1 is more than H2. Therefore, the height difference between the photoresist layer in the first region and the photoresist layer in the second region is H1-H2. In this embodiment, in step 2, the photoresist layer is a positive photoresist. In other words, after the positive photoresist is exposed, the exposed part is dissolved during development.

In step 3, a photomask is provided. An auxiliary pattern for exposing the first region and another pattern for exposing the second region are formed on the photomask. The auxiliary pattern includes a plurality of unit patterns distributed in an array. The numbers of rows and columns of the array are respectively more than 1.

Further, in this embodiment of the present application, in step 3, the unit patterns are strip-shaped rectangular structures.

Further, in this embodiment of the present application, in step 3, the spacing between each unit pattern and its adjacent unit pattern is 40 nm.

Further, in this embodiment of the present application, in step 3, the dimension of the unit patterns is 30 nm.

Further, in this embodiment of the present application, in step 3, the dimension of the auxiliary pattern is less than the minimum dimension in a design rule of an exposure layer.

Figure 2A:
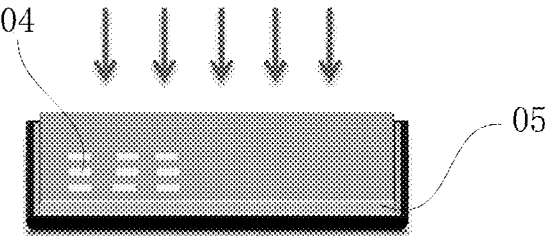
FIG. 2*a* illustrates a schematic diagram of a photomask on a semiconductor front layer structure according to the present disclosure.
Figure 2B:
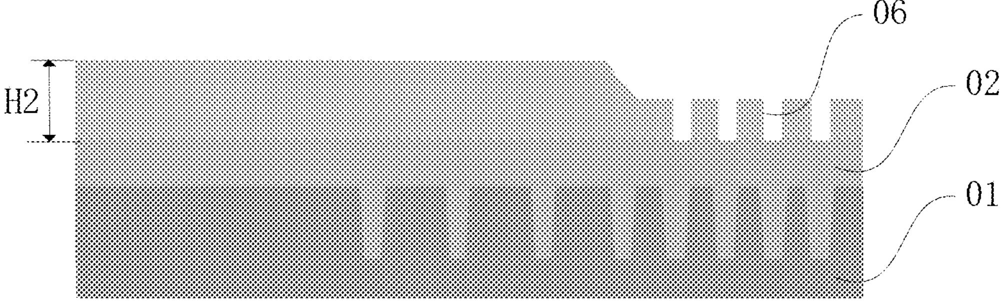
FIG. 2*b* illustrates a schematic diagram of the semiconductor front layer structure after developing the first region in the present invention.

Referring to FIGS. 2*a* and 2*b*, it illustrates a schematic diagram of the semiconductor front layer structure according to the present disclosure. In step 3, a photomask 05 is provided. An auxiliary pattern 04 for exposing the first region and a pattern (not shown on the photomask 05 in FIG. 1) for exposing the second region are formed on the photomask 05. The auxiliary pattern 04 includes a plurality of unit patterns distributed in an array. The number of rows and columns of the array is respectively more than 1. In other words, the unit patterns are arranged on the photomask 05 in the form of rows and columns. In this embodiment, in step 3, the unit patterns are strip-shaped rectangular structures. In this embodiment, in step 3, the spacing (trench) between each unit pattern and an adjacent unit pattern is no larger than 40 nm. In this embodiment, in step 3, the dimension (Critical Dimension) of the unit patterns is no larger than 30 nm. In other words, this makes the pitch of the auxiliary pattern at about 70 nm. In this embodiment, in step 3, the dimension of the auxiliary pattern 04 is less than the minimum dimension in a design rule of an exposure layer. Therefore, the auxiliary pattern will not be exposed on the photoresist layer due to exposure, so the auxiliary pattern will not be transferred to the photoresist layer after development.

In step 4, the first region and the second region of the photoresist layer are simultaneously exposed by using the photomask, and the exposure intensity is adjusted, so that after the first region is developed, part of the surface of the first region is dissolved with development, the auxiliary pattern is not transferred to the photoresist layer in the first region, and the thickness of the photoresist layer in the first region after development is H2; and so that after the second region is developed, the pattern is transferred to the photoresist layer in the second region.

Further, in this embodiment of the present application, in step 4, the thickness of the photoresist layer in the first region after development is equal to the thickness of the photoresist layer in the second region after development.

The method applies in a process for a FinFET structure with a process node of 14 nm.

Referring to FIG. 2*a*, in step 4, the first region and the second region of the photoresist layer are simultaneously exposed by using the photomask 05, and the exposure intensity is adjusted, so that by means of suitable exposure intensity, after the first region is developed, part of the surface of the first region is dissolved with development, the auxiliary pattern is not transferred to the photoresist layer in the first region, and the thickness of the photoresist layer in the first region after development is H2; and so that after the second region is developed, the pattern is transferred to the photoresist layer in the second region, thus forming a photoresist pattern 06 in FIG. 2*b*. Referring to FIG. 2*b*, in this embodiment, in step 4, the thickness of the photoresist layer in the first region after development is equal to the thickness of the photoresist layer in the second region after development.

To sum up, the present disclosed technique thins the region with a thick photoresist layer by adding the auxiliary pattern in the photomask, and simultaneously exposing other regions normally without the auxiliary pattern For the region with the thick photoresist layer, part of the surface of the photoresist layer is dissolved during development by adjusting the local overall light intensity and the dimension of the auxiliary pattern to achieve the goal of adjusting the local thickness of the photoresist. Therefore, the present application effectively overcomes various disadvantages in the existing technology and has a high industrial utilization value.

The above embodiments are only used for exemplarily describing the principle and effect of the present application, instead of limiting the present application. Those skilled in the art may modify or change the above embodiments without departing from the spirit and scope of the present application. Therefore, all equivalent modifications or changes made by those with ordinary knowledge in the technical field without departing from the spirit and technical concept disclosed in the present application should still be covered by the claims of the present application.

What is claimed is:

1. A method for adjusting a local thickness of a photoresist in semiconductor manufacturing, wherein the method at least comprises:

step 1: providing a semiconductor front layer structure, wherein the semiconductor front layer structure comprises:
- a silicon substrate;
- a shallow-trench-isolation (STI) area for isolating active regions in the silicon substrate, wherein the active regions in the silicon substrate are configured to include strip structures, wherein the strip structures are configured to have different heights; and
- a stack structure disposed on the strip structures, wherein the stack structure forms regions of different surface heights from uneven strip structures underneath, wherein the stack structure comprises second nitrogen doped silicon carbide (NDC2), silicon dioxide (SiO2), nitrogen doped silicon carbide (NDC), nitrogen trifluoride (NF), and titanium nitride (TiN) sequentially stacked from bottom to top on the silicon substrate;

step 2: spin-coating a photoresist layer on a top surface of the stack structure, wherein the photoresist layer disposed on a portion of the stack structure having a higher surface comprises a first thickness H1, and the photoresist layer disposed on a portion of the stack structure having a lower surface comprises a second thickness H2, wherein H1>H2;

step 3: providing a photomask, wherein the photomask comprises an auxiliary pattern for exposing a first region and another pattern for exposing a second region, wherein the auxiliary pattern comprises a plurality of unit patterns distributed in an array, wherein a number of rows and a number of columns in the array are integers larger than 1; and step 4: exposing the first region and the second region of the photoresist layer simultaneously by the photomask, and adjusting an exposure intensity to achieve underexposure in the first region, wherein, after photoresist development only part of the first region is dissolved, the auxiliary pattern is not transferred to the photoresist layer into the first region, and a thickness of the photoresist layer in the first region becomes H2, and wherein the other pattern on the photomask is transferred to the photoresist layer in the second region.

2. The method for adjusting the local thickness of the photoresist according to claim 1, wherein, in step 3, the unit patterns are strip-shaped rectangular structures.

3. The method for adjusting the local thickness of the photoresist according to claim 2, wherein, in step 3, a dimension of the unit patterns is 30 nm.

4. The method for adjusting the local thickness of the photoresist according to claim 1, wherein, in step 3, a spacing between each unit pattern and an adjacent unit pattern is 40 nm.

5. The method for adjusting the local thickness of the photoresist according to claim 1, wherein, in step 2, the photoresist layer comprises a positive photoresist.

6. The method for adjusting the local thickness of the photoresist according to claim 5, wherein, in step 4, the thickness of the photoresist layer in the first region after development is equal to the thickness of the photoresist layer in the second region after the development.

7. The method for adjusting the local thickness of the photoresist according to claim 1, wherein, in step 3, a dimension of the auxiliary pattern is less than a minimum dimension according to a design rule of an exposure layer.

* * * * *